United States Patent
Underbrink (10) Patent No.: US 7,082,292 B2
(45) Date of Patent: *Jul. 25, 2006

(54) MOBILE COMMUNICATIONS DEVICE WITH GPS RECEIVER AND COMMON CLOCK SOURCE

(75) Inventor: Paul A. Underbrink, Lake Forest, CA (US)

(73) Assignee: SiRF Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/658,185

(22) Filed: Sep. 9, 2003

(65) Prior Publication Data

US 2004/0132421 A1   Jul. 8, 2004

Related U.S. Application Data

(63) Continuation-in-part of application No. 09/551,060, filed on Apr. 18, 2000, now Pat. No. 6,650,879.

(51) Int. Cl.
*H04Q 7/20* (2006.01)

(52) U.S. Cl. ............... 455/255; 455/13.2; 455/259

(58) Field of Classification Search ............... 455/255, 455/259, 13.2, 13.3, 69, 76, 88, 550.1, 5, 455/86, 264, 188, 190.1, 552; 342/357.02, 342/357.05, 357.01, 357.12; 701/213, 214
See application file for complete search history.

(56) References Cited

U.S. PATENT DOCUMENTS

| | | |
|---|---|---|
| 5,119,504 A | 6/1992 | Durboraw, III |
| 5,523,761 A | 6/1996 | Gildea |
| 5,535,432 A | 7/1996 | Dent |
| 5,734,966 A | 3/1998 | Farrer et al. |
| 5,841,396 A | 11/1998 | Krasner |
| 6,002,363 A | 12/1999 | Krasner |
| 6,041,222 A | 3/2000 | Horton et al. |
| 6,088,348 A | 7/2000 | Bell, III et al. |
| 6,097,974 A | 8/2000 | Camp et al. |
| 6,300,899 B1 | 10/2001 | King |
| 6,314,111 B1 | 11/2001 | Nandikonda et al. |

FOREIGN PATENT DOCUMENTS

WO    WO 99/57929 A1    11/1999

*Primary Examiner*—Jean Gelin
(74) *Attorney, Agent, or Firm*—Edward C. Kwok; MacPherson Kwok Chen & Heid LLP (57) ABSTRACT

A mobile communications device using a common oscillator for communication and global positioning system (GPS) functions. In one embodiment, a communications unit receives a precision carrier frequency signal from a source and generates a reference signal that is used to calibrate a common oscillator.

26 Claims, 8 Drawing Sheets

MOBILE COMMUNICATIONS DEVICE WITH GPS RECEIVER AND COMMON CLOCK SOURCE

RELATED APPLICATIONS

This patent application is a continuation-in-part of U.S. patent application Ser. No. 09/551,060, filed Apr. 18, 2000, now U.S. Pat. No. 6,650,879, and entitled Personal Communication Device with GPS Receiver and Common Clock Source, which is hereby incorporated by reference in its entity.

FIELD OF THE INVENTION

This invention is generally related to mobile communications devices having global positioning system ("GPS") capabilities. More particularly, embodiments of the invention relate to using a common oscillator for communication functions and GPS functions.

BACKGROUND

Mobile communications devices incorporating global positioning system ("GPS") capabilities are becoming popular. In these devices, the circuitry and components necessary to provide the GPS capabilities must share the same enclosure and circuit board real estate as the circuitry and components dedicated to providing, for example, mobile (cellular) telephone capabilities. Further, circuitry and components for both GPS capabilities and as mobile telephone capabilities are typically powered by the same power source, for example, via an on-board battery. While battery technology is improving, it is typical that the more power consumed by a device the larger the physical size of the battery required to provide a given operating time.

The demand for smaller, more compact mobile communication devices is increasing. Concurrent with this increasing demand for compactness is the demand for devices that provide for increased functionality and capabilities. As functionality and capabilities increase, typically, so does the need for power and printed circuit real estate within the mobile communications device.

Figure 1:
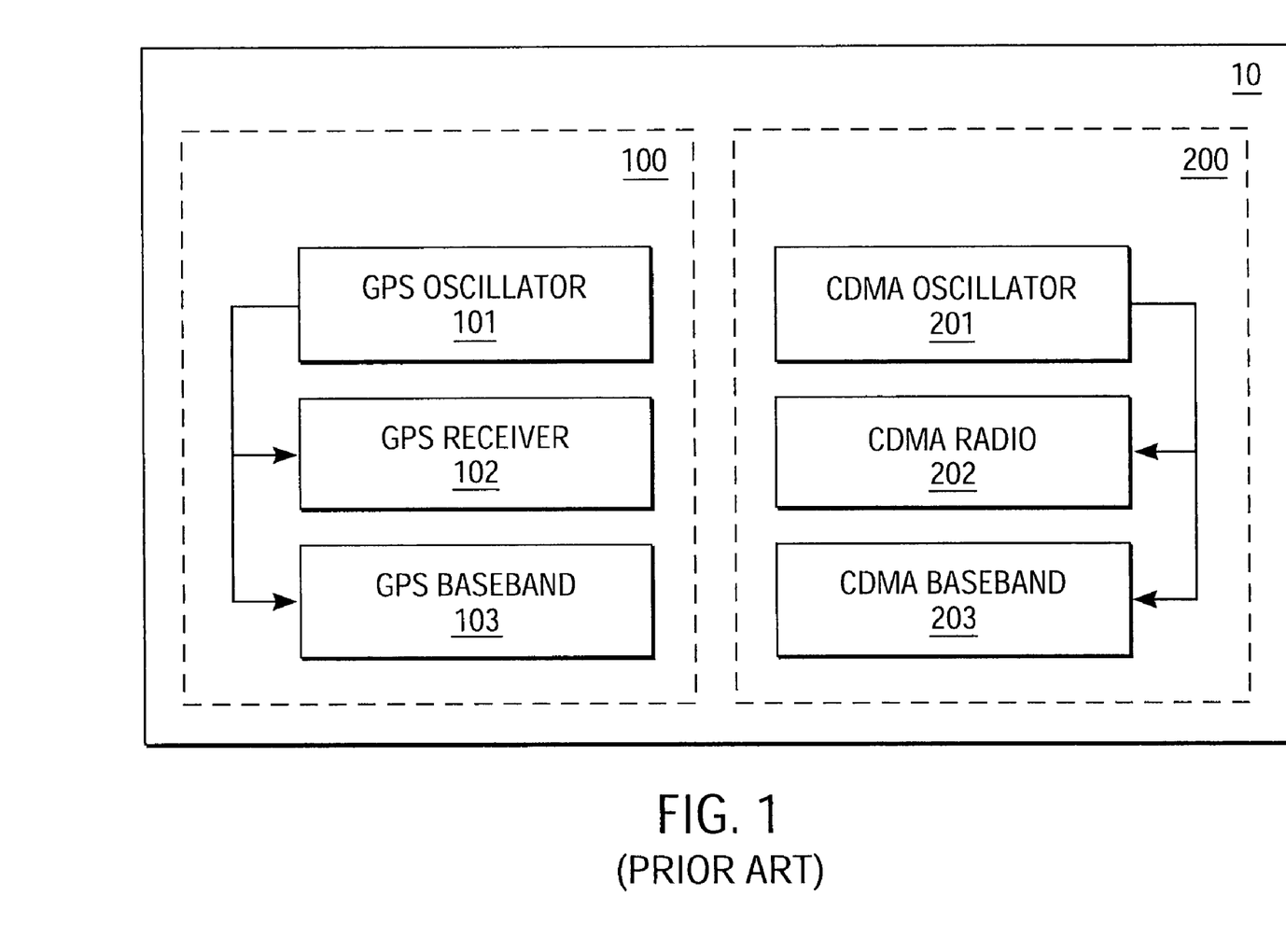
FIG. 1 is a block diagram of a prior art mobile communications device.

Mobile communications devices, such as device 10 in FIG. 1, incorporate a global positioning system (GPS) receiver 100 and a communications device, such as a code division multiple access (CDMA) based communications device 200. Device 10 is a personal communications device, such as a cellular phone or any other personal mobile device with communication and GPS capabilities. In devices such as device 10 it is common for separate clock sources (oscillators) to be associated with the GPS receiver 100 and the CDMA device 200. More particularly, GPS receiver 100 includes an associated oscillator 101 while CDMA device 200 includes an associated oscillator 201. Each of the oscillators 101 and 201 provides a clock signal to the respective circuitry to which it is associated.

Figure 2:
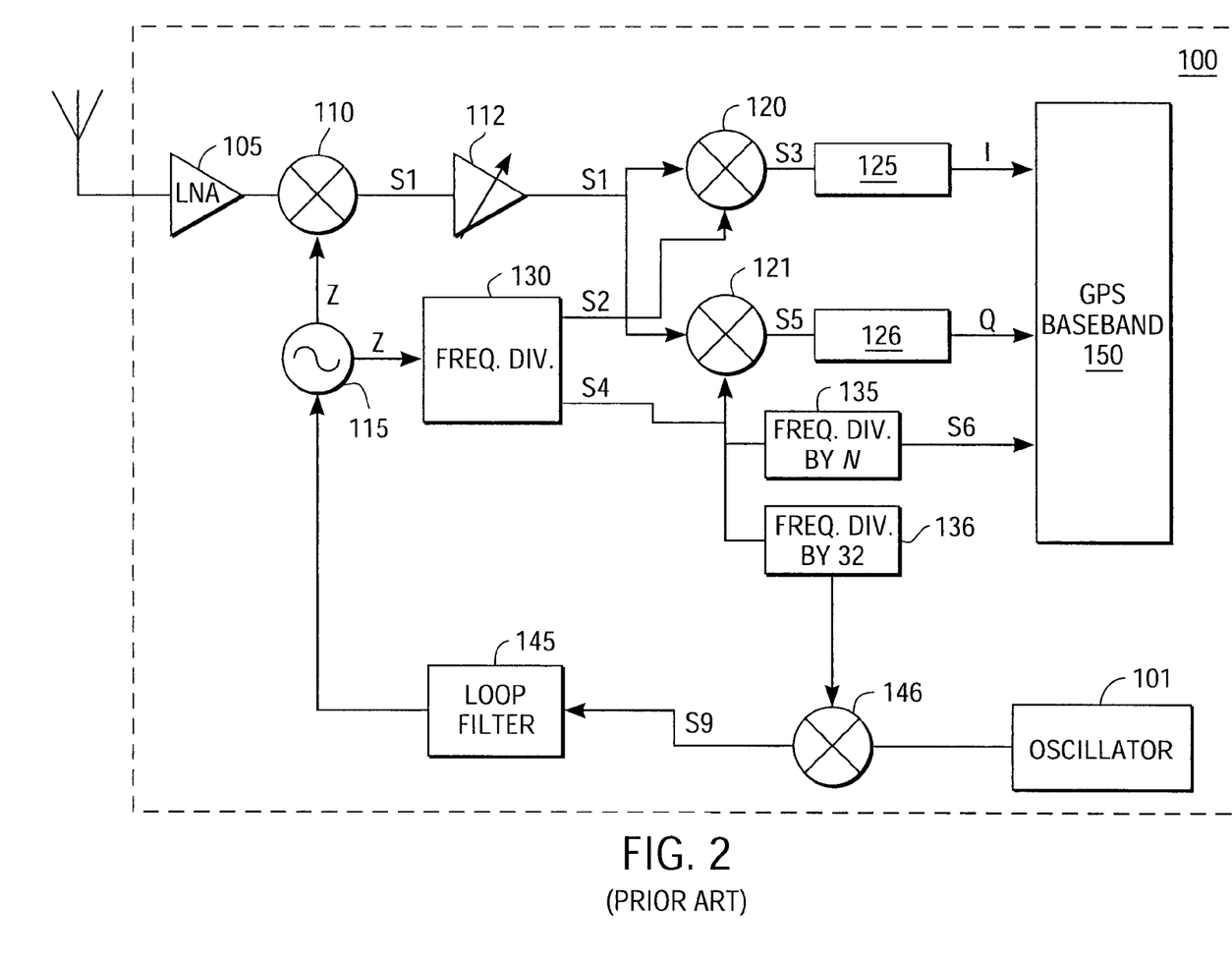
FIG. 2 is a block diagram of a prior art GPS receiver.

FIG. 2 is a block diagram of the GPS receiver 100, which includes oscillator 101. Oscillator 101 provides a signal of a particular frequency to a phase comparator 146. Phase comparator 146 also receives input from frequency divider 136 and outputs a signal to loop filter 145. Loop filter 145 provides a signal to voltage controlled oscillator (VCO) 115 which generates an output signal whose frequency is contingent upon the signal input from loop filter 145. The signal from VCO 115 is provided to mixer 110 where it is combined with a radio frequency (RF) signal from low noise amplifier (LNA) 105 to produce a first intermediate frequency (IF) signal S1. This first IF signal S1 is provided to variable amplifier 112 and then on to mixer 120 and mixer 121. In mixer 120, the signal S1 is combined with a signal S2 from frequency divider 130 to produce an in-phase second IF frequency output signal S3. In mixer 121, the signal S1 is combined with a signal S4 from frequency divider 130 to produce a quadrature-phase second IF frequency output signal S5. Signal S3 is provided to comparator and A to D processor 125 to produce a digitized signal I for output to GPS baseband section 150. Signal S5 is provided to comparator and A to D processor 126 to produce a digitized signal Q for output to GPS baseband section 150. Frequency divider 130 also provides its output signal S4 to frequency divider 135 and frequency divider 136. The output from VCO 115 is also provided to frequency divider 130. Frequency divider 130 outputs a signal S4 that is mixed by mixer 121 with a signal S1 to produce a signal S5.

As two separate oscillators are provided within the same mobile communications device 10, printed circuit board and/or integrated circuit real estate is devoted to accommodating each oscillator. Another disadvantage is that power consumption of the two oscillators is greater than for one oscillator. Thus it is desirable to have a mobile communications device that overcomes the stated disadvantages.

SUMMARY OF THE DISCLOSURE

Embodiments of the invention include a mobile communications device having global positioning systems ("GPS") provisions and communications provisions sharing a common clock source. The mobile communications device may employ any of several known communication methods and standards. For example, a Code Division Multiple Access (CDMA) method may be used. CDMA is a method for describing physical radio channels. Data intended for a specific channel is modulated with that channel's code. These are typically pseudorandom in nature, and possess favorable correlation properties to ensure physical channels are not confused with one another. CDMA techniques are employed within cdmaOne™, CDMA2000™, and Universal Mobile Telecommunications System (UMTS).

Embodiments of the invention are further compatible with devices using 2G, 2.5G, 3G and upcoming 4G systems. Embodiments are applicable to mobile communication devices that incorporate a satellite positioning receiver (ex: GPS, GLONASS, GALELIO). Second Generation (2G) systems were developed as the requirement for mobile communications grew. Characteristics of 2G systems included the use of digital signaling across the air interface, roaming, security and the ability to carry data as well as speech. 2.5G is a term used to refer to enhanced data services including High Speed Circuit Switched Data (HSCSD) (High Speed Circuit Switched Data), 14.4 Kbps Global System for Mobile Communication (GSM) Data, and General Packet Radio Service (GPRS). 3G is the term given to the next generation of mobile communication systems. These offer enhanced services, such as multimedia and video. The main 3G technologies include UMTS and CDMA2000™. 3G was an initiative originally spearheaded by the International Telecommunications Union (ITU) under the IMT2000 project.

Time Division Multiple Access (TDMA) is a communications technique that is also applicable to embodiments of the invention. TDMA uses a common channel for communications among multiple users by allocating each a unique time slot. TDMA standards like US Digital (IS-136), European GSM (Global System for Mobile Communication) and Japanese PDC are examples of such implementations.

Integrated Enhanced Digital Network (iDEN™) is a wireless solution that uses TDMA methods and allows the combination of capabilities such as two-way digital radio, digital wireless phone, alphanumeric messaging, data/fax, etc., in one device.

UMTS is a third generation (3G) mobile communications system which provides an enhanced range of multimedia services. UMTS is expected to speed convergence between telecommunications, Information technology (IT), media, and content industries. The specifications defining UMTS are formulated by Third generation Partnership Project (3GPP). 3G and 3GPP are discussed further below.

The Third Generation Partnership Project (3GPP) is a governing body formed in December 1998 as a collaboration agreement bringing together a number of telecommunication standards bodies. These standards bodies are referred to as Organizational Partners. The original aim of the 3GPP was to produce globally applicable technical specifications for third generation mobile systems based on evolved GSM core networks and the radio access technology Universal Terrestrial Radio Access (UTRA). This was subsequently amended to include the maintenance and development of the GSM standards including GPRS and Enhanced Data rates for Global Evolution (EDGE). This group is currently driving the standards for WCDMA or UMTS.

The 3GPP2 is a sister project to 3GPP and is a collaboration agreement dealing with North American and Asian interests regarding third generation mobile networks. It is comprised of five Standards Development Organizations similar to the Organizational Partners in the 3GPP. The partnership is comprised of a number of Technical Specification Groups which meet around ten times per year and are responsible for the following five areas: A-interface system, CDMA2000™, ANSI-41 (American National Standards Institute-41), wireless packet data interworking and services and systems aspects.

The Telecommunications Industry Association (TIA) is a trade group representing manufacturers and suppliers of communications and information technology products. TIA is a standards developing organization accredited by ANSI.

The Institute of Electrical and Electronics Engineers (IEEE) is a professional organization whose activities include the development of communications and network standards very widely used in the communications industry. Wireless Fidelity (WiFi) is an interoperability standard developed by Wireless Ethernet Compatibility Alliance (WECA) and issued to those manufacturers whose IEEE 802.11a, 802.11b and 802.11g compliant equipment has passed a suite of basic interoperability tests.

New standards are in the works for Ultra Wide Band (UWB) and a recent consortium between industry leader TI and Intel has started to work on 802.15.3a standard.

Some of the known methods and standards have been listed. Embodiments of the invention include using a common clock for communication functions and GPS functions. The communication function can be according to the communication methods and standards listed, as well as additional methods and standards not listed.

GPS provisions include a feedback loop for controlling an oscillator generating a GPS signal based upon the common clock signal. The feedback loop includes a frequency synthesizer for generating a feedback control signal, a phase comparator for generating a control signal in accordance with the feedback signal and the common clock signal, and a loop filter for processing and outputting the control signal to the oscillator to control the frequency of GPS system signals.

Embodiments include a system for providing a clock signal to a GPS receiver based upon a common clock source. In one embodiment, the system is implemented with a mobile communications system and a common clock source for providing a clock signal to a GPS receiver and to a communications unit. The GPS receiver includes a frequency synthesizer that provides a feedback signal for controlling an oscillator to provide a GPS system clock signal.

Embodiments also include a method for providing a system clock signal to a GPS receiver. For example, in one embodiment, a clock signal is received from a clock source, a control voltage is generated for controlling the frequency of an oscillator signal generated by an oscillator based upon a feedback signal from a frequency synthesizer, and a system clock signal of a particular frequency is generated in response to the control voltage.

Other embodiments including systems, methods, features, and advantages not explicitly described herein, but within the scope of the invention as defined by the claims, may be available to one of ordinary skill in the art upon examination of the following figures and detailed description.

BRIEF DESCRIPTION OF THE FIGURES

The following figures are provided for assistance in describing embodiments of the invention, and are not intended to be exclusive or limiting. In the figures, like reference numerals designate like elements.

DETAILED DESCRIPTION

Embodiments of the invention include a mobile communications device with global GPS capabilities, wherein a single oscillator acts as a clock source for communications circuitry and for GPS circuitry.

Figure 3:
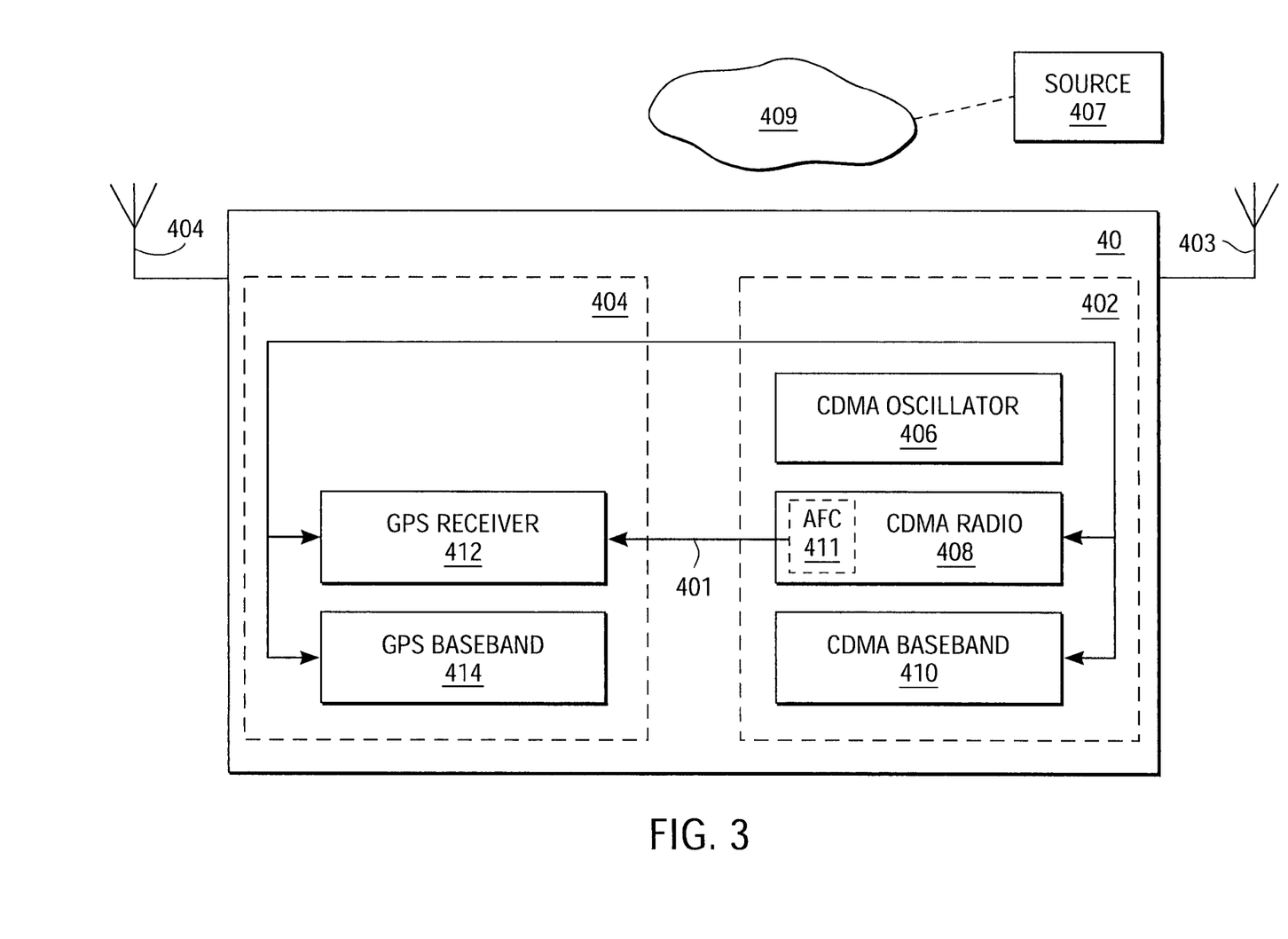
FIG. 3 is a block diagram of a communications device of an embodiment.

FIG. 3 is a block diagram of a communications device 40 according to an embodiment of the invention. The communications device 40 may be, for example, a mobile telecommunications device that receives and processes communications signals. The communications device 40 also receives and processes GPS signals. The device 40 includes a GPS receiver 404 and a communications unit 402. In one embodiment, the communications unit 402 is a code division multiple access ("CDMA") based communications unit. GPS receiver 404 includes a GPS receiver 412 and a GPS baseband unit 414. GPS receiver 412 receives and processes GPS signals and provides them to the baseband unit 414 for further processing, such as extraction of data.

The communications unit 402 includes a CDMA radio unit, or receiver, 408 for receiving, processing and transmitting CDMA based RF signals and a CDMA baseband unit 410 for further processing of CDMA based RF signals received or to be transmitted. CDMA communications unit 402 includes an oscillator 406 for providing a clock signal to circuitry of the CDMA communications unit 402 and to GPS receiver 404. More particularly CDMA oscillator 406 provides a clock signal to CDMA radio 408, CDMA baseband unit 410 and to GPS receiver 412 and GPS baseband unit 414.

The device 40 includes a communications antenna 403 and a GPS antenna 405. The communications antenna receives signals from and transmits signals to other units (not shown) remote from the device 40. For example, in one embodiment the device 40 is a cellular phone that communicates with other units in a network 409, including other phones and one or more base stations (not shown). In one embodiment the communications antenna 403 includes one antenna for receiving and another antenna for transmitting. In various embodiments, the device 40 may receive aiding data from a source 407, which can be for example a base station, via the communications antenna 403. The aiding data can include anything that helps the device 40 to more quickly or efficiently perform acquisition and tracking of GPS satellites. The aiding data includes satellite almanac data, ephemeris data, data regarding which satellites are in view, Doppler data, etc.

In one embodiment, the aiding data includes time reference information in the form of a time reference signal that is used to calibrate the oscillator. The time reference signal can be generated in a variety of ways. For example, in one embodiment, the source generates a precision carrier frequency signal using a reference oscillator or GPS signals according to known methods. The precision carrier frequency signal is received by the CDMA radio 408 via the communications antenna 403. In one embodiment, the CDMA radio 408 includes an automatic frequency control (AFC) element 411 that locks to the signal. Various AFC methods and configurations are known in the art, for example phase locked loops and block phase estimators. Any known AFC elements can be used. The output of the AFC element 411 is a reference signal 401 that is locked in frequency to the precision carrier frequency signal. The reference signal 401 can be used by the device 40 to calibrate a relatively low quality, low cost oscillator 406, which can then be used to acquire GPS satellite signals, as further explained below.

Figure 4:
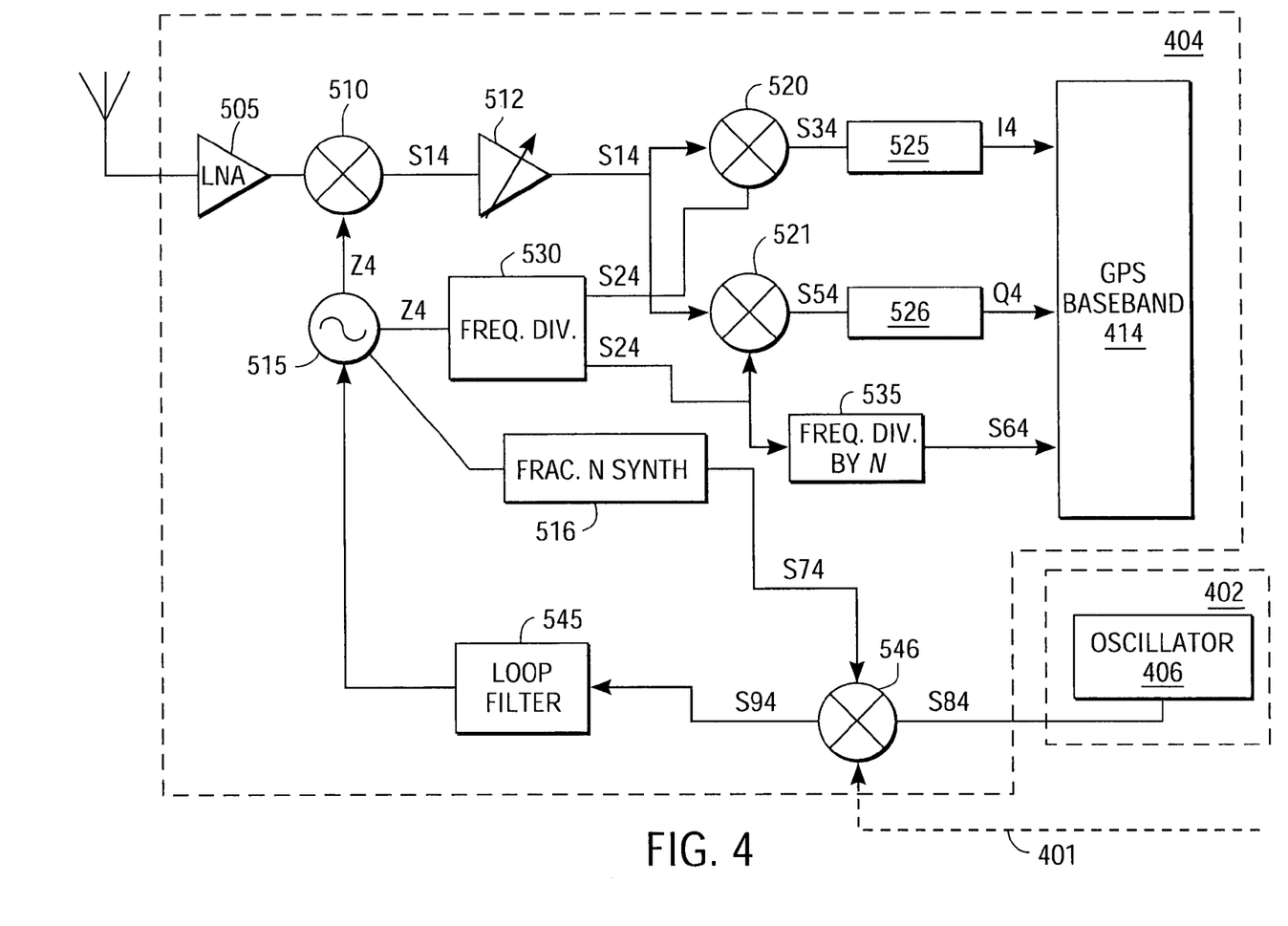
FIG. 4 is a more detailed block diagram of elements of FIG. 3.

FIG. 4 is a block diagram of the GPS receiver 404. The GPS receiver 404 operates to acquire and track GPS signals received via the GPS antenna 405. In various embodiments, the GPS receiver operates with various types and degrees of aiding from the communications unit 402. One embodiment of the GPS receiver will now be described with reference to FIG. 4. The GPS receiver 404 includes a voltage controlled oscillator (VCO) 515 which generates a GPS system clock signal Z4 whose frequency is dependent upon a control voltage signal S94 from loop filter 545. The GPS system clock signal Z4 from VCO 515 is provided to mixer 510, which acts as a downconverter. The GPS system clock signal Z4 from VCO 515 is combined with a received RF signal from low noise amplifier (LNA) 505 to produce a first downconverted, or intermediate frequency (IF), signal S14. This first IF signal S14 is provided to amplifier 512 and then to mixer 520 and mixer 521. At mixer 520, the first IF signal S14 is combined with a signal S24 from frequency divider 530 to produce a second IF frequency output signal S34. At mixer 521, the first IF signal S14 is combined with a signal S44 (also from frequency divider 530) to produce a further IF frequency output signal S54. The signal S44 is also provided to frequency divider 535 where it is converted into a signal of alternate frequency S64 and output to GPS baseband unit 414.

Signal S34 is input to a comparator and A-to-D converter 525 where it is processed and converted into a digital output signal 14 for input to the GPS baseband unit 414. Likewise signal S54 is input to a comparator and A-to-D converter 526 where it is processed and converted into a digital output signal Q4 which is provided to the GPS baseband unit 414.

The GPS system clock signal Z4 output from VCO 515 is also provided to frequency divider 530 and a frequency synthesizer 516. Frequency synthesizer 516 converts the signal Z4 from VCO into a feedback signal S74 that is provided to a phase comparator 546. The phase comparator 546 outputs a control signal S94 to a loop filter 545 in response to the input of the feedback signal S74 and a clock signal S84 from the oscillator 406. Control signal S94 is then provided to VCO 515, which adjusts the frequency of the output signal Z4 in accordance with the control signal S94. In this illustration it can be seen that there is a feedback loop composed of frequency synthesizer 516, phase comparator 546 and loop filter 545.

An alternative embodiment of the GPS receiver 404 will now be described with reference to FIG. 4. In the alternative embodiment, the oscillator signal 284 is compared with the reference signal 401 to produce the signal S94. The reference signal 401 is described above with reference to FIG. 3. The reference signal 401 is locked to a precision carrier frequency signal received by the communications unit 402. The result of the comparison of the reference signal 401 to the oscillator signal S84 (the control signal S94) is an indication of any error in the oscillator signal S84. The control signal S94 is provided to the loop filter 545 and eventually to the VCO 515 to provide a high quality calibrated oscillator signal Z4 to the mixer 510 which produces the IF signal S14.

Figure 5:
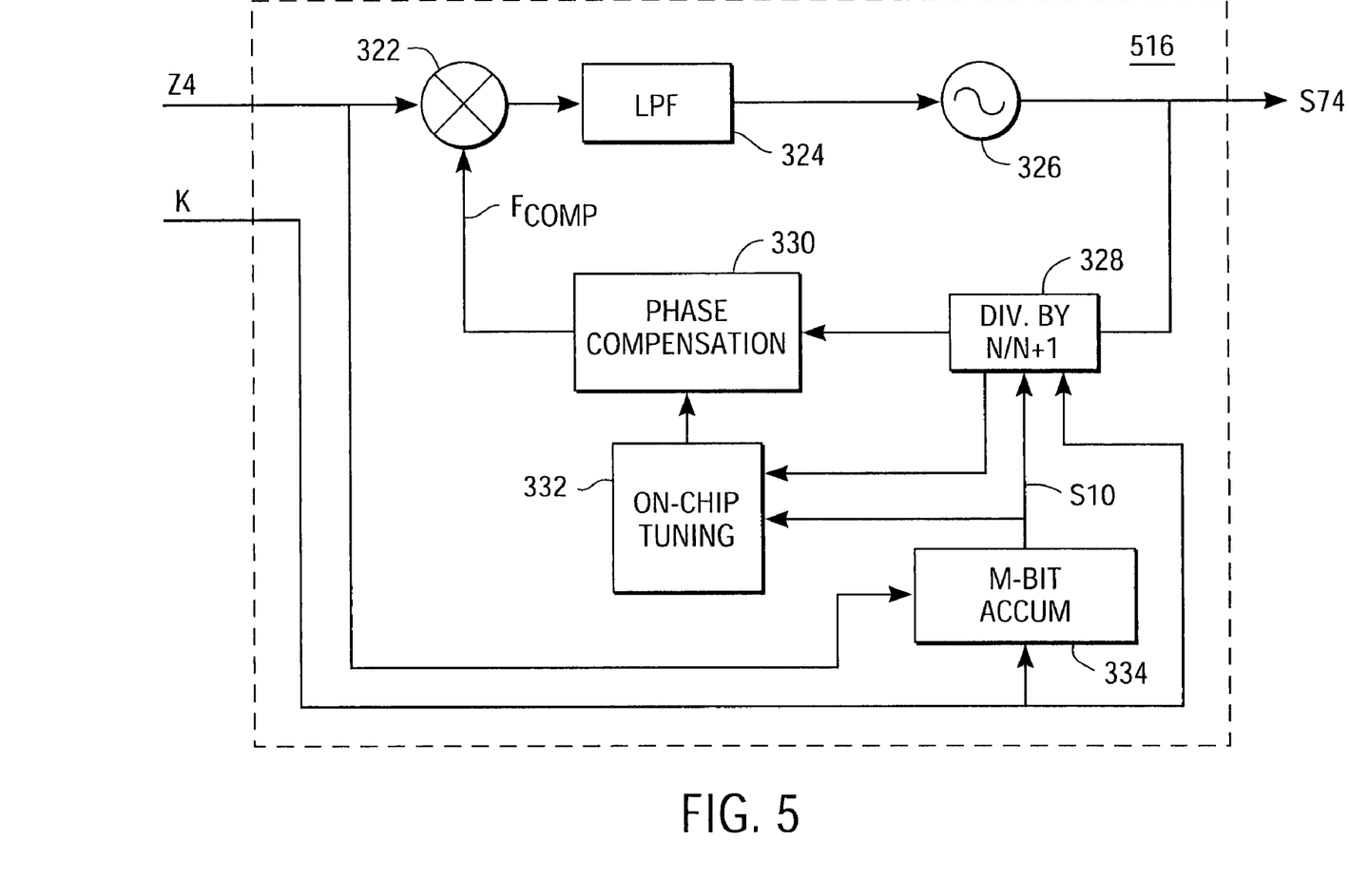
FIG. 5 is a block diagram of an embodiment of a fractional-N frequency synthesizer.

FIG. 5 is a block diagram of an embodiment of the frequency synthesizer 516. In one embodiment, the frequency synthesizer 516 is a phase interpolated fractional-N frequency synthesizer. The synthesizer 516 can be implemented as an integrated circuit using known CMOS fabrication methods or other compatible semiconductor technologies. A reference signal Z4 from VCO 515 is provided to an input of a phase detector 322. The output of the phase-detector 322 is provided to a loop filter 324. The output of the loop filter 324 is provided to a controlled oscillator 326, such as a VCO, which has an output S74 (feedback signal S74) that is the output of the synthesizer 516. The signal S74 is supplied to a fractional-N divider 328. A control word K is supplied to the fractional-N divider 328 in order to set the value of the divisor.

The output of the fractional-N divider 328 is provided to a phase compensation circuit 30 and to an on-chip tuning circuit 332. The phase compensation circuit 330 and the on-chip tuning circuit 331 can be referred to collectively as a phase compensator. The output (fcomp) from the phase compensation circuit 330 is provided as an input to the phase detector 322. An accumulator 334 also receives control word K and the signal Z4. The carry-out signal S10 from the accumulator 334 is input to the fractional-N divider 328. The signal Z4 serves as the clocking signal for the accumulator 334. The carry-out signal S10 triggers a divide by N+1 function of the fractional-N divider 328.

The phase detector 322, loop filter 324 and VCO 326 may be of any suitable type known to those of ordinary skill in the art. Virtually any commonly used phase detectors, loop filters, controlled oscillators and fractional-N dividers can be used. For example, voltage or current controlled oscillators, phase or phase/frequency detectors, active or passive loop filters and loop filters with charge pumps can all be used.

Figure 6:
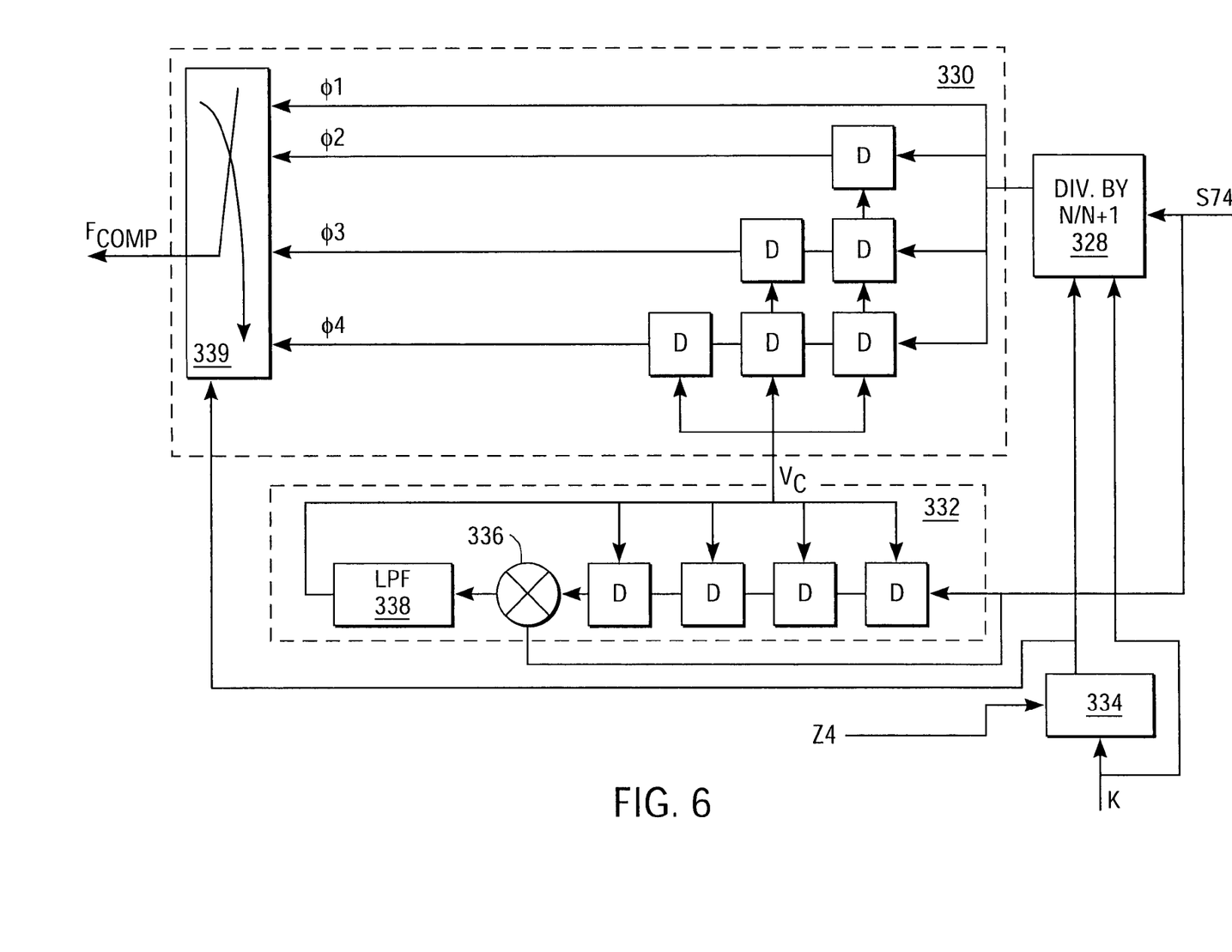
FIG. 6 is a block diagram of an embodiment of a phase compensation circuit and an on-chip tuning circuit.

FIG. 6 is a block diagram of an embodiment of the phase compensation circuit 330 and the on-chip tuning circuit 332. The phase compensation circuit 330 and the on-chip tuning circuit 332 may be implemented using an arrangement of voltage controlled delay elements D. The voltage controlled delay elements D provide a signal delay of Tvco/4, where Tvco equals the period of the output signal S74 of the VCO 326.

The output of the fractional-N divider 328 is applied to a series of delay lines whose outputs are identified as $\phi 1$–$\phi 4$. It will be noted that $\phi 1$ has no delay elements, while $\phi 2$ has a single delay element, $\phi 3$ has two delay elements and $\phi 4$ has three delay elements. The signals $\phi 1$–$\phi 4$ are provided to control circuitry 339. The control circuitry 339 has an output signal fcomp that is applied to an input of the phase detector 322. The output fcomp of control circuitry 339 is selectively switched among the inputs $\phi 1$–$\phi 4$ according to the output of the accumulator 334 which is provided to the control circuit 339.

The on-chip tuning circuit 332 includes four voltage control delay elements D, a phase detector 336 and a loop filter 338. In one embodiment, the on-chip tuning circuit 332 is implemented as a delay locked loop. The signal S74 from VCO 326 passes through the four delay elements (D) of the on-chip tuning circuit 332 and is then provided to the phase detector 336. In addition, the signal S74 is also applied to the phase detector 336. The phase detector 336 outputs a signal proportional to the difference in phase between the two input signals. The output of the phase detector 336 then passes through a loop filter 338. The output Vc of the loop filter 338 is used as a control voltage for each of the delay elements D of the on-chip tuning circuit 332. The period of control voltage Vc is ¼ the period of the input signal to the delay locked loop. The tuning circuit 332 determines or adjusts the value of the delay elements according to the input frequency.

Figure 7:
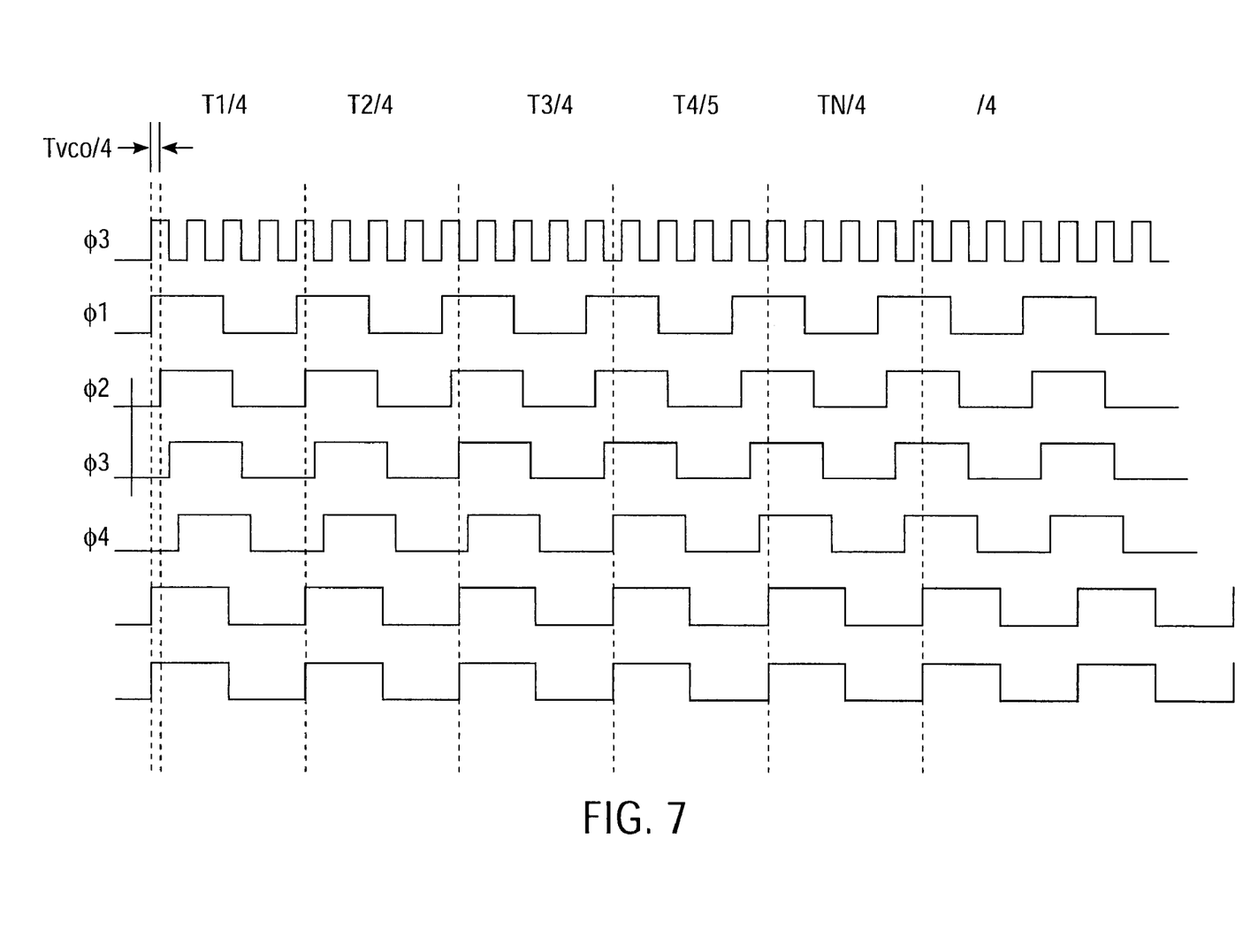
FIG. 7 is a timing diagram illustrating a relationship between signals of a frequency synthesizer in relation to the signals of a compensation circuit according to an embodiment.

FIG. 7 is a timing diagram that illustrates relationships between various signals of the synthesizer 516 in relation to the signals of the phase compensation circuit 330 and the on-chip tuning circuit 332. In the example of FIG. 7, S10=4.25(Z4). The divider 328 is programmed for N=4 (via control word K). The accumulator 334 is programmed (via control word K) to generate a carry signal S10 at every fourth cycle of the signal Z4. Each time interval T is equal to one cycle of Z4. During the time interval T1–T4, signal S10 has 17 cycles and Z4 has 4 cycles. During the time interval T1, the fractional-N divider 328 divides the signal S1 by 4. In the second time period T2 and the third time period T3, the divider 328 again divides the signal S10 by 4. At the beginning of the fourth time period, T4, the accumulator 334 generates the carry signal S10, which causes the divider to divide by N+1. In this example N+1=5. Therefore, signal Z4 is divided by five during T4.

During the time period T1, the phase compensation circuit 330, more specifically, control circuit 339, provides the signal $\phi 1$ to the phase detector 322. At the beginning of the time period T1, signal $\phi 1$ is in phase with the signal Z4. At the beginning of the time period $\phi 2$, the output of the phase compensation circuit 330 switches to $\phi 2$. Switching of the output of the control circuit 339 is controlled by the output of the accumulator 334, which is clocked by the signal Z4. In this case, $\phi 2$ is in phase with Z4 at the output of the phase compensation circuit 330. Similarly, at the beginning of the time period T3, the output of the phase compensation circuit 330 switches to $\phi 3$ and then at the beginning of the time period T4, the output of the phase compensation circuit 330 switches to $\phi 4$. The pattern then repeats. In this way, the phase lag of the divider 328 is compensated for.

Figure 8:
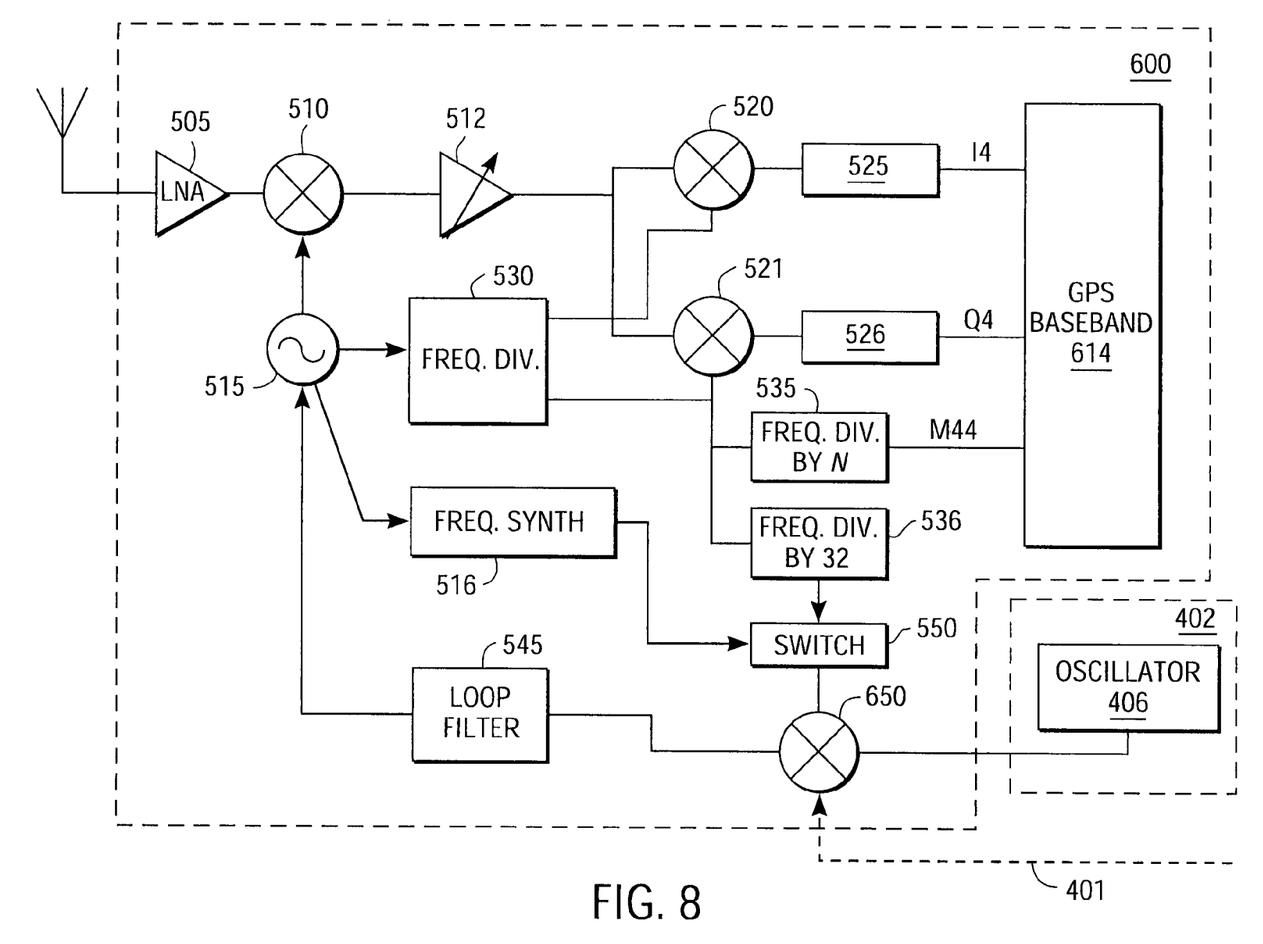
FIG. 8 is an embodiment of a GPS receiver and oscillator.

FIG. 8 is a block diagram of an alternate embodiment in which provisions are made for selectivity providing feedback to the phase comparator 650 via the fractional-N synthesizer 516 or the frequency divider 536. In this embodiment a switch 550 is provided for switching between the output of fractional-N synthesizer 516 or frequency divider 536 for input to a phase comparator 650. Switch 550 may be a multiplexor or other logic gating. Further, switch 550 can be permanently set to a desired position during manufacture or could remain selectively switchable and controllable via application of an appropriate switching signal.

Embodiments of the invention can be implemented in the systems described in U.S. Pat. No. 5,874,914 for "GPS Receiver Utilizing A Communication Link" and in U.S. Pat. No. 5,841,396 also, for a "GPS Receiver Utilizing A Communication Link". Here there is disclosed a GPS receiver that incorporates a first antenna for receiving a GPS signal and a downcoverter coupled to the first antenna. The first antenna provides the GPS signals to the downconverter. A local oscillator is coupled to the downconverter and provides a reference signal to the downconverter to convert the GPS signals from a first frequency to a second frequency. A second antenna is provided for receiving a precision carrier frequency signal from a source of the precision carrier frequency signal. An automatic frequency control (AFC) circuit is coupled to the second antenna. The AFT circuit provides a second reference signal to the local oscillator to calibrate the first reference signal from the local oscillator. The local oscillator is used to acquire the GPS signals.

There is also described a mobile, GPS receiver having a first antenna for receiving GPS signals and a downconverter coupled to the first antenna. The first antenna provides the GPS signals to the downconverter. The downconverter has an input for receiving a local oscillator signal to convert the GPS signals from a first frequency to a second frequency. The second antenna is provided for receiving a precision carrier frequency signal from a source providing the precision carrier frequency signal. An automatic frequency control (AFC) circuit is coupled to the second antenna. The AFC circuit is also coupled to the downconverter to provide the local oscillator signal that is used to acquire the GPS signals. The disclosures of U.S. Pat. No. 5,874,914 and U.S. Pat. No. 5,841,396 are hereby incorporated by reference.

Further, the present invention can be implemented in the system described in U.S. Pat. No. 6,002,363 for "Combined GPS Positioning Systems and Communication System Utilizing Shared Circuitry." The disclosure of U.S. Pat. No. 6,002,363 is hereby incorporated herein by reference. U.S. Pat. No. 6,002,363 discloses among other things, a GPS receiver which includes a GPS antenna for receiving data representative of GPS signals from at least one satellite; a digital processor coupled to the GPS antenna, the digital processor processes the data representative of GPS signals from at least one satellite, including performing a matched filtering operation to determine a pseudorange based on the data representative of GPS signals. The digital processor also processes communication signals received through a communication link, the processing of communication signals comprising demodulation of communication signals sent to the GPS receiver.

Additionally, the present invention can be implemented in the system described in U.S. Pat. No. 5,734,966 for a "Wireless Communications System For Adapting to Frequency Drift." The disclosure of U.S. Pat. No. 5,734,966 is hereby incorporated herein by reference. U.S. Pat. No. 5,734,966 disclosed among other things a frequency tolerant wireless transceiver to receive and transmit on the wireless signal energy on the same frequency and to automatically adjust to that frequency, the transceiver includes: an antenna to receive a wireless data signal, including application data from one or more remote transceivers, at an actual frequency and issue this signal as a conducted radio frequency (RF) data signal and to transmit a wireless return signal at the actual frequency to the remote transceiver in response to a conducted RF return signal; a synthesizer to generate a local oscillator (LO) signal sequentially in response to a first and a second frequency control signal, and to generate the RF return signal at the actual frequency in response to the second frequency control signal and having modulation in response to a digital return signal; a direct conversion receiver to receive the LO signal to down convert the RF data signal to a baseband data signal; a frequency discriminator to receive the baseband data signal, to provide a frequency difference signal for the current frequency difference between the expected frequency and the actual frequency, and to demodulate the baseband data signal, and to issue a demodulated data signal; and a microcontroller system having a receive adjust mode to provide the first frequency control signal predictive of an expected frequency and to receive the frequency difference signal, having a receive data mode to process the frequency difference signal, to provide the second frequency control signal predictive of the actual frequency, and to receive the demodulated data signal, including the application data, and to provide the digital return signal.

There is further disclosed a frequency tolerant transceiver to automatically adjust to receive a radio frequency (RF) data signal on an actual frequency and to transmit an RF return signal on that same frequency, the transceiver comprising: a synthesizer for sequentially generating a local oscillator (LO) signal and the RF return signal, the LO signal sequentially having a first frequency corresponding to an expected frequency of the RF data signal and a second frequency corresponding to the actual frequency of the RF data signal in response to a first and a second frequency control signal, respectively, the RF return signal having the second frequency in response to the second frequency control signal; and a microcontroller system having a receive adjust mode for providing the first frequency control signal predictive of the expected frequency and providing the second frequency control signal for the actual frequency based upon a frequency difference between the actual frequency and the expected frequency.

The mobile communications device of the invention can be implemented in hardware, software, firmware, or a combination thereof. In the preferred embodiment(s), the mobile communications device is implemented in software or firmware that is stored in a memory and that is executed by a suitable instruction execution system. If implemented in hardware, as in an alternative embodiment, the mobile communications device of the invention can be implemented with any or a combination of the following technologies, which are all well known in the art: discrete logic circuit(s); application specific integrated circuit(s) ("ASICs"); a programmable gate array(s) ("PGA"), field programmable gate array(s) ("FPGAs"); etc.

The embodiments of the invention described herein possible examples of implementations, set forth to aid in understanding the invention. Many variations and modifications may be made to the above-described embodiment(s) of the invention without departing substantially from the sprit and principles of the invention. All such modifications and variations are intended to be included herein within the scope of the invention as defined by the following claims.

What is claimed is:

1. A mobile communications device comprising:
   a communications unit configured to receive communications data from a source, wherein the communications data includes a precision signal; and
   a global positioning system (GPS) unit coupled to the communications unit, wherein the GPS unit includes a phase-locked loop having a phase interpolated fractional frequency synthesizer, the phase-locked loop providing a reference signal phased-locked to the precision signal, the reference signal being provided to downconvert a GPS satellite signal.

2. The device of claim 1, further comprising an automatic frequency control (AFC) element coupled to a communications antenna to receive a carrier signal, wherein the AFC is configured to generate the precision signal as a signal locked in frequency to the carrier signal.

3. The device of claim 2, further comprising, in the phase-locked loop, a phase comparator that receives the precision signal and the reference signal and outputs an error control signal.

4. The device of claim 3, further comprising a voltage controlled oscillator configured to receive the error control signal-and to output the reference signal.

5. The device of claim 4 further comprising a downconverter that receives the reference signal and the GPS satellite signal and outputs an intermediate frequency signal.

6. A mobile global positioning system (GPS) device, comprising:
   a first antenna for receiving GPS signals;
   a downconverter coupled to the first antenna, wherein the first antenna provides the GPS signals to the downconverter, wherein the downconverter includes an input for receiving a reference clock signal to convert the GPS signals from a first frequency to a second frequency;
   a second antenna for receiving a precision carrier frequency signal from a source;
   an automatic frequency control (AFC) circuit coupled to the second antenna to receive the precision carrier frequency signal and configured to generate a precision reference signal related in frequency with the precision carrier frequency signal; and
   a phase-locked loop having a phase interpolated frequency synthesizer, the phase-locked loop providing the reference clock signal phase-locked to the precision reference signal.

7. The device of claim 6, further comprising, in the phase-locked loop, a phase comparator that receives the reference clock signal and the precision reference signal.

8. The device of claim 7, further comprising a receiver coupled to the second antenna, wherein the receiver receives the precision carrier frequency signal, and further receives a data signal containing satellite data.

9. The device of claim 8, wherein the satellite data includes Doppler data related to a satellite in view of the receiver.

10. The device of claim 9, wherein the satellite data further includes an identification of a plurality of satellites in view of the receiver and a corresponding plurality of Doppler information related to the plurality of satellites.

11. The device of claim 10, wherein the satellite data further includes ephemeris data related to a satellite in view of the receiver.

12. A mobile communications device, comprising:
a GPS antenna for receiving GPS signals;
a downconverter coupled to the GPS antenna, wherein the GPS antenna provides the GPS signals to the downconverter;
a communications unit, including, a communication antenna for receiving a precision carrier frequency signal from a source; and an automatic frequency control (AFC) circuit coupled to the communication antenna, wherein the AFC circuit provides a reference signal based on the precision carrier frequency signal; and
an oscillator coupled to the downconverter, wherein the oscillator provides an oscillator signal phase-locked to the reference signal for mixing with the GPS signals in the downconverter, the oscillator signal being provided by a phase-locked loop having a phase interpolated fractional frequency synthesizer.

13. A personal communications device comprising:
a telecommunications unit comprising a device selected from a group comprising, a code division multiple access (CDMA) device, a WCDMA device, a FDMA device, a OFDMA device, a UMTS-compatible device, a UWB-compatible device, a TDMA device, a WiFi device, a PDC device, an iDEN™ device, and a GSM device, wherein the telecommunications unit further comprises a clock source; and
a global positioning system (GPS) receiver, wherein the GPS receiver comprises a voltage controlled oscillator for generating a GPS system clock signal based upon the clock source, and a feedback loop for controlling the voltage controlled oscillator, wherein the feedback loop comprises, a phase comparator for generating a control signal in accordance with the feedback signal and the clock source; and a loop filter for processing the control signal and outputting the control signal to the voltage controlled oscillator.

14. The personal communications device of claim 13 wherein the clock source provides a common clock signal to the global positioning receiver and the telecommunications unit.

15. The personal communications device of claim 13 wherein the clock source comprises a crystal oscillator.

16. The personal communications device of claim 13 wherein the frequency synthesizer comprises:
a controlled oscillator having a variable output controlled by an input signal;
a frequency divider coupled to receive the output of the controlled oscillator and responsive to the output to provide a frequency divided output signal;
a phase compensation circuit coupled to receive the frequency divided output signal from the frequency divider, the phase compensation circuit responsive to the frequency divided output signal to provide an output which compensates for phase lag of the frequency divided output of the frequency divider; and
a phase detector coupled to receive an output of the phase compensation circuit and the GPS system clock signal and to output a signal proportional to a difference in phase between the output of the phase compensation circuit and the GPS system clock signal to control the controlled oscillator.

17. The personal communications device of claim 13 wherein the divider is a fractional-N divider.

18. The personal communications device of claim 13 wherein the controlled oscillator is a voltage controlled oscillator.

19. The personal communications device of claim 13 further comprising a switch for selectable engaging the feedback loop to control the voltage controlled oscillator.

20. The personal communications device of claim 13 wherein the switch is permanently set during manufacture.

21. A method of clocking GPS receiver operations according to claim 13, wherein the telecommunications unit comprises a CDMA based telecommunications unit.

22. A method of clocking GPS receiver operations comprising the steps of:
receiving a clock signal from a clock source selected from a group comprising, a code division multiple access (CDMA) device clock, a WCDMA device clock, a FDMA device clock, a OFDMA device clock, a UMTS-compatible device clock, a UWB-compatible device clock, a TDMA device clock, a WiFi device clock, a PDC device clock, an iDEN™ device clock, and a GSM device clock;
generating a control voltage for controlling a frequency of an oscillator signal generated by a voltage controlled oscillator based upon a feedback signal by a frequency synthesizer; and
generating a system clock signal of a particular frequency in response to the control voltage, wherein the frequency synthesizer generating the feedback signal includes,
receiving the system clock signal;
frequency dividing the system clock signal by at least two integer values to generate a fractional-N divider signal over a discrete time period;
generating a variably delayed signal based upon the fractional-N divided signal within the discrete time period; and comparing a phase of the variably delayed signal and a reference signal and varying the system clock signal according to a detected phase difference.

23. A method of clocking GPS receiver operations according to claim 22, wherein the clock source comprises a crystal oscillator.

24. A personal communications device comprising:
means for receiving a telecommunications signal selected from a group comprising, a code division multiple access (CDMA) device means, a WCDMA device means, a FDMA device means, a OFDMA device means, a UMTS-compatible device means, a UWB-compatible device means, a TDMA device means, a WiFi device means, a PDC device means, an iDEN™ device means, and a GSM device means;
means for receiving a global positioning system (GPS) signal comprising an oscillator for generating a GPS system clock signal and a feedback loop for generating and providing a control signal to the oscillator; and
means for generating a clock source signal to be provided to the means for receiving a global positioning system (GPS) signal and the means for receiving a telecommunications signal, wherein the feedback loop comprises,
a frequency synthesizer for generating a feedback signal; and a phase comparator for generating a control signal in accordance with the feedback signal and the clock source signal.

25. A personal communications device according to claim 24 wherein the means for receiving a telecommunications signal comprises a code division multiple access (CDMA) based radio frequency receiver.

26. A personal communications device according to claim 24 wherein the means for receiving a telecommunications signal includes the means for generating a clock source signal, and wherein the means for generating a clock source signal comprises a crystal oscillator.

* * * * *